United States Patent
Shimazawa et al.

(10) Patent No.: US 8,957,692 B2
(45) Date of Patent: Feb. 17, 2015

(54) METHOD FOR PERFORMING BURN-IN TEST

(75) Inventors: Koji Shimazawa, Tokyo (JP); Masaaki Kaneko, Tokyo (JP); Takashi Honda, Hong Kong (HK); Yoichi Mugino, Kyoto (JP); Yoshito Nishioka, Kyoto (JP); Tsuguki Noma, Kyoto (JP)

(73) Assignees: TDK Corporation, Tokyo (JP); Rohm Co., Ltd., Kyoto (JP)

( * ) Notice: Subject to any disclaimer, the term of this patent is extended or adjusted under 35 U.S.C. 154(b) by 1112 days.

(21) Appl. No.: 12/958,692

(22) Filed: Dec. 2, 2010

(65) Prior Publication Data

US 2012/0139566 A1 Jun. 7, 2012

(51) Int. Cl.
| | |
|---|---|
| G01R 31/00 | (2006.01) |
| G11B 5/455 | (2006.01) |
| H01S 5/00 | (2006.01) |
| G11B 5/105 | (2006.01) |
| G11B 5/31 | (2006.01) |
| G01R 31/26 | (2014.01) |
| G11B 5/00 | (2006.01) |

(52) U.S. Cl.
CPC .............. *G11B 5/455* (2013.01); *H01S 5/0042* (2013.01); *G11B 5/105* (2013.01); *G11B 5/3166* (2013.01); *G11B 5/3173* (2013.01); *G01R 31/2635* (2013.01); *G01R 31/2642* (2013.01); *H01S 5/0021* (2013.01); *G11B 2005/0021* (2013.01)
USPC .................................................. 324/755.05

(58) Field of Classification Search
None
See application file for complete search history.

(56) References Cited

U.S. PATENT DOCUMENTS

| | | | |
|---|---|---|---|
| 4,489,477 A | | 12/1984 | Chik et al. |
| 4,775,640 A | * | 10/1988 | Chan ............................... 438/16 |
| 7,391,227 B2 | | 6/2008 | Inoue et al. |
| 7,538,978 B2 | | 5/2009 | Sato et al. |
| 2008/0002298 A1 | | 1/2008 | Sluzewski |
| 2008/0043360 A1 | | 2/2008 | Shimazawa et al. |
| 2008/0056073 A1 | | 3/2008 | Shimizu |
| 2009/0052078 A1 | | 2/2009 | Tanaka et al. |

FOREIGN PATENT DOCUMENTS

| | | |
|---|---|---|
| CN | 2821578 Y | 9/2006 |
| JP | A-60-233880 | 11/1985 |

OTHER PUBLICATIONS

Kang et al., "Laser Diode Burn - In & Life Testing System," *Computer Measurement & Control*, 2003, pp. 250-253, vol. 11, No. 4.
Office Action issued in Chinese Application No. 201110392791.3 dated Dec. 26, 2013 (with translation).

*Primary Examiner* — Paresh Patel
(74) *Attorney, Agent, or Firm* — Oliff PLC

(57) ABSTRACT

Provided is a method for performing a burn-in test on an object under test in which a plurality of electrodes are provided in positions at different heights. The method comprising steps of: preparing an object under test in which an electrode in a higher position have a higher surface roughness among the plurality of electrodes; bringing a plurality of sheet-type probes into contact with the plurality of electrodes, respectively; and supplying an electric current with the plurality of electrodes through the plurality of sheet-type probes. By implementing the method, the sheet-type probes can be kept in stable contact with the electrodes because electrodes in a higher position have a higher surface roughness Ra than electrodes in a lower position. Consequently, stable and reliable burn-in test can be performed.

14 Claims, 10 Drawing Sheets

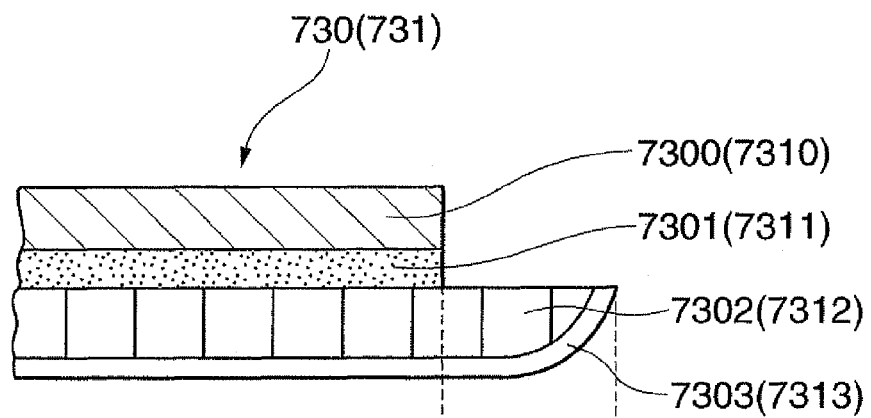
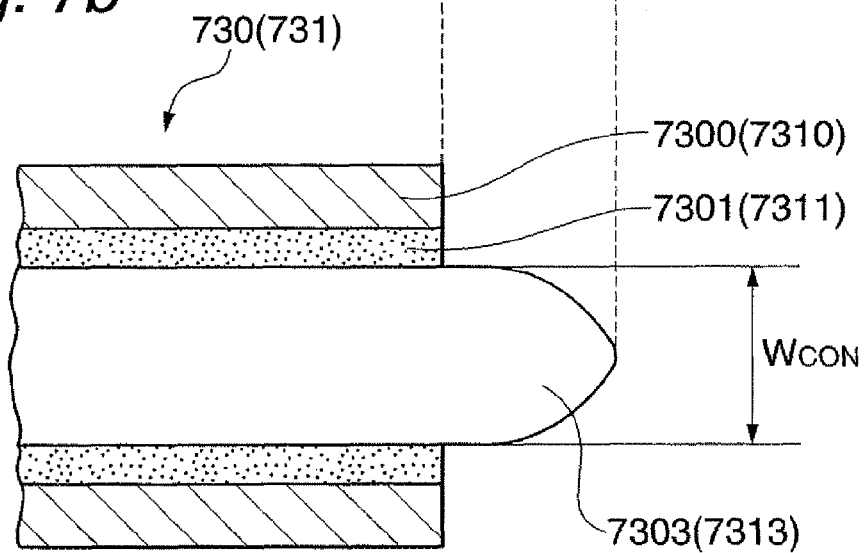

METHOD FOR PERFORMING BURN-IN TEST

BACKGROUND OF THE INVENTION

1. Field of the Invention

The present invention relates to a method for performing burn-in test which is a current-carrying test effective for screening target elements. The present invention especially relates to a burn-in test applied to a light source unit that includes a light source for thermally-assisted magnetic recording, and to a test apparatus for performing the burn-in test.

2. Description of the Related Art

With the explosion in the use of the Internet in these years, a huge amount of data that are incommensurably larger than ever are stored and used on computers such as servers and information-processing terminals. This trend is expected to further grow at an accelerated rate. Under these circumstances, demand for magnetic recording apparatuses such as magnetic disk apparatuses as mass storage is growing, and the demand for higher recording densities of the magnetic recording apparatuses is also escalating.

In the magnetic recording technology, it is necessary for magnetic heads to write smaller recording bits on magnetic recording media in order to achieve higher recording densities. In order to stably form smaller recording bits, perpendicular magnetic recording technology has been commercially implemented in which components of magnetization perpendicular to the surface of a medium are used as recording bits. In addition, thermally-assisted magnetic recording technology that enables the use of magnetic recording media having higher thermal stability of magnetization is being actively developed.

In the thermally-assisted magnetic recording technology, a magnetic recording medium formed of a magnetic material with a large energy $K_U$ is used so as to stabilize the magnetization, then anisotropic magnetic field of a portion of the medium, where data is to be written, is reduced by heating the portion; just after that, writing is performed by applying write field to the heated portion. Actually, there has been generally used a method in which a magnetic recording medium is irradiated and thus heated with a light such as near-field light (NF-light). In this case, it is significantly important where and how a light source with a sufficiently high light output should be disposed inside a head in order to stably supply a light with a sufficiently high intensity at a desired position on the magnetic recording medium.

As for the setting of the light source, for example, U.S. Pat. No. 7,538,978 B2 discloses a configuration in which a laser unit including a laser diode is mounted on the back surface of a slider, and US Patent Publication No. 2008/0056073 A1 discloses a configuration in which a structure of a laser diode element with a monolithically integrated reflection mirror is mounted on the back surface of a slider.

The present inventors propose a thermally-assisted magnetic recording head with a "composite slider structure" which is constituted by joining a light source unit provided with a light source to the end surface (back surface) of a slider provided with a write head element, the end surface being opposite to the opposed-to-medium surface of the slider. The "composite slider structure" is disclosed in, for example, US Patent Publication No. 2008/043360 A1 and US Patent Publication No. 2009/052078 A1. The advantages of the thermally-assisted magnetic recording head with the "composite slider structure" are as follows:

a) The head has an affinity with the conventional manufacturing method of thin-film magnetic heads because the opposed-to-medium surface and the element-integration surface are perpendicular to each other in the slider;

b) The light source can avoid suffering mechanical shock directly during operation because the light source is provided far from the opposed-to-medium surface; and c) The head can be manufactured with reduced man-hour and at low cost, because of no need to provide the head with optical components such as a lens or prism which are required to have much high accuracy, or with optical elements having a special structure for connecting optical fibers or the like.

Furthermore, in the "composite slider structure", the following can be singled out for special mention with respect to characteristic evaluation and reliability evaluation in the manufacturing process:

d) The light source such as a laser diode and the head elements can be evaluated independently of each other; thus the degradation of manufacturing yield for obtaining the whole head can be avoided; whereas, in the case that all the light source and head elements are provided within the slider, the manufacturing yield rate for obtaining the whole head is likely to decrease significantly due to the multiplication of the process yield for the light-source and the process yield for the head elements.

Here, in order to evaluate the reliability of a light source unit including a light source, in particular, a laser diode, burn-in test is an effective way for the evaluation. The burn-in test involves passing an electric current through devices under test (laser diode herein) to measure and evaluate change with time in a characteristic of the devices under test in a conduction state at high temperatures, thereby screening out defective devices. However, the burn-in test takes very long time, for example several to several tens of hours, per laser diode. In addressing this inefficiency, it is very effective to simultaneously evaluate multiple laser diodes at a bar-level before being cut into individual light-source-unit chips in a light source unit manufacturing process. With this parallel operation, burn-in test can be performed on many laser diodes at a time, thereby the number of man-hours and time required to perform the evaluation step can be significantly reduced.

However, it is extremely difficult to bring power-supply probes into contact with an enormous number of electrodes for multiple laser diodes provided on a unit bar at a time. In practice, when metal needles, which are commonly used, are used as the probes, a probe card on which a large number of needles, for example several hundred needles are provided upright needs to be provided for burn-in test of a single unit bar. However, the needles are expensive and, in addition, if a single needle on the card fails to make contact, all needles on the card need to be replaced, which is very uneconomical. Furthermore, when needles are brought into contact with upper electrodes of laser diodes, excessive mechanical stress can be applied to the laser diodes.

When a characteristic of multiple magnetic head elements arranged on a slider bar is evaluated, the needles described above can be used as probes. Such evaluation of a characteristic of magnetic head elements requires only a small amount of measurement time which is on the order of seconds or less per magnetic head element. Therefore, a required number needles for evaluation of one magnetic head element can be used as probes to successively evaluate a characteristic of the individual magnetic head elements on a slider bar in sequence.

It may be contemplated to use sheet-type probes, which are less expensive than needle-type probes, instead of using the needles described above, to perform burn-in test on a unit bar.

However, it is very difficult to stably supply power with individual electrodes for laser diodes with sheet-type probes.

In practice, in a unit bar in which laser diodes are provided, electrodes with which sheet-type probes are to make contact are on both of the laser diodes and unit substrates.

That is, multiple electrodes are provided in positions at different heights. The difference in height between an electrode on a laser diode and an electrode on a unit substrate is exactly equal to the height of the laser diode, which is on the order of 10 micrometers (μm) or greater. The quality of contact between a sheet-type probe and an electrode depends in large part on the angle at which the tip of the sheet-type probe makes contact with the electrode. Accordingly, there has been a problem that when sheet-type probes are brought into contact with an electrode on a laser diode and an electrode on a unit substrate which significantly differs in height, the angle at which the sheet-type probes makes contact with the electrode on the laser diode is relatively shallow and therefore the contact between the electrode on the laser diode and the sheet-type probe becomes unstable.

A laser diode is preferably placed so that its p-electrode side faces down (faces the unit substrate) in order to provide more effective heat dissipation. In a laser diode, the active layer which generates the most heat is located closer to the p-electrode side. By placing the laser diode so that its p-electrode side faces down, the active layer is positioned closer to the unit substrate. As a result, the unit substrate can be made more effectively function as a heat sink. However, the electrode on the laser diode in this case is an n-electrode. Typically, the surface of the n-electrode is highly smoothed in order to allow stable wire-bonding required for the laser diode to be mounted in a can package which houses and protects the laser diode. Therefore, when a sheet-type probe makes contact with the electrode on the laser diode at a shallow angle, the contact between the sheet-type probe and the electrode is unstable.

As can be seen from the foregoing, there is a great demand for development of a method of burn-in test that can be efficiently performed on a light source unit constituting a thermally-assisted magnetic recording head having a "composite slider structure" at low cost.

SUMMARY OF THE INVENTION

Some terms used in the specification will be defined before explaining the present invention. In a layered structure or an element structure formed in the element-integration surface of a slider substrate or in the source-installation surface of a unit substrate of the magnetic recording head according to the present invention, when viewed from a standard layer or element, a substrate side is defined as "lower" side, and the opposite side as an "upper" side. Further, "X-, Y- and Z-axis directions" are indicated in some figures showing embodiments of the head according to the present invention as needed. Here, Z-axis direction indicates above-described "up-and-low" direction, and +Z side corresponds to a trailing side and −Z side to a leading side. And Y-axis direction indicates a track width direction.

According to the present invention, provided is a method for performing a burn-in test on an object under test in which a plurality of electrodes are provided in positions at different heights. The method comprising steps of:

preparing an object under test in which an electrode in a higher position have a higher surface roughness among the plurality of electrodes;

bringing a plurality of sheet-type probes into contact with the plurality of electrodes, respectively; and supplying an electric current with the plurality of electrodes through the plurality of sheet-type probes.

In the method for performing a burn-in test, it is preferable that the object under test includes a plurality of units provided on a wafer or a bar, each of the units including: an element having a predetermined height; and a lower electrode electrically connected to a lower surface of the element, and that the object under test is prepared in such a manner that a surface roughness of an upper electrode on the upper surface of the element is higher than a surface roughness of the lower electrode. Further in this preferable case, it is also preferable that the object under test is prepared by grinding a surface of a substrate of the element to a predetermined surface roughness, the surface being on a side on which the upper electrode is to be formed, then forming the upper electrode on the surface and thus providing a predetermined surface roughness to a surface of the upper electrode.

According to the present invention, further provided is a method for performing a burn-in test on a unit bar to be divided into chips, each of the chips being configured to be used as a light source unit for thermally-assisted magnetic recording, the light source unit including a laser diode provided in a unit substrate. The method comprising steps of:

preparing a unit bar in such a manner that an upper electrode on an upper surface of the laser diode has a surface roughness higher than a lower electrode electrically connected to a lower surface of the laser diode;

bringing a sheet-type probe for the upper electrode and a sheet-type probe for the lower electrode into contact with the upper electrode and the lower electrode, respectively; and supplying an electric current to the laser diode through the sheet-type probe for the upper electrode and the upper electrode and through the sheet-type probe for the lower electrode and the lower electrode.

In the method for performing a burn-in test according to the present invention, the sheet-type probes can be kept in stable contact with electrodes on a unit bar on which multiple electrodes are provided in positions at different heights, because electrodes in a higher position have a higher surface roughness Ra than electrodes in a lower position. Consequently, stable and reliable burn-in test can be performed. In addition, the multiple laser diodes on the unit bar can be evaluated at a time before the unit bar is diced into individual light-source-unit chips. The simultaneous process enables burn-in test to be performed on a large number of laser diodes at a time, and therefore the man-hours and time required for the reliability evaluation process can be significantly reduced.

In the method for performing a burn-in test according to the present invention, the unit bar is preferably prepared in such a manner that a height of the laser diode is 40 μm (micrometers) or more and is 100 μm or less. Further, the unit bar is preferably prepared in such a manner that the surface roughness Ra of the upper electrode is 0.5 μm or more and is 10 μm or less, and a surface roughness Ra of the lower electrode is 0.005 μm or more and is 0.5 μm or less. Furthermore, it is also preferable that the unit bar is prepared by grinding a surface of a substrate of the laser diode to a predetermined surface roughness, the surface being on a side on which the upper electrode is to be formed, then forming the upper electrode on the surface and thus providing a predetermined surface roughness to a surface of the upper electrode.

Furthermore, in the method for performing a burn-in test according to the present invention, it is preferable that the sheet-type probes for the upper electrode and the lower electrode comprise a base element, an insulating layer formed on the base element, and a conductive layer formed on the insulating layer, and the conductive layer protrudes from the base element on a side on which the conductive layer contacts the lower electrode or the upper electrode. Further, in the sheet-type probes, at least a portion of the conductive layer on a side on which the conductive layer contacts the lower electrode or the upper electrode is preferably covered with gold or a gold alloy. Furthermore, it is preferable that the laser diode is supplied with electric current, then measuring changes over time in electric current supplied to the laser diode required for obtaining a predetermined light output from the laser diode.

According to the present invention, a test apparatus configured to implement the above-described method for performing a burn-in test is further provided, which comprises:

a holding jig for holding the unit bar;

a sheet-type probe set including sheet-type probes for upper electrodes and sheet-type probes for lower electrodes, one sheet-type probe for the upper electrode and one sheet-type probe for the lower electrode being arranged alternately, the upper electrode being provided on the laser diode and having a surface roughness higher than the lower electrode;

a photodetector held by the holding jig, the photodetector receiving laser light emitted from the laser diode supplied with an electric current through the sheet-type probe set, and measuring light output of the laser diode; and a controller receiving a measurement output from the photodetector and controlling and measuring an electric current supplied to the laser diode.

Further objects and advantages of the present invention will be apparent from the following description of preferred embodiments of the invention as illustrated in the accompanying figures. In each figure, the same element as an element shown in other figure is indicated by the same reference numeral. Further, the ratio of dimensions within an element and between elements becomes arbitrary for viewability.

BRIEF DESCRIPTION OF THE DRAWINGS

FIGS. 7a and 7b show a cross-sectional view and a bottom view of a structure of sheet-type probes used in the burn-in test;

DESCRIPTION OF THE PREFERRED EMBODIMENTS

Figure 1:
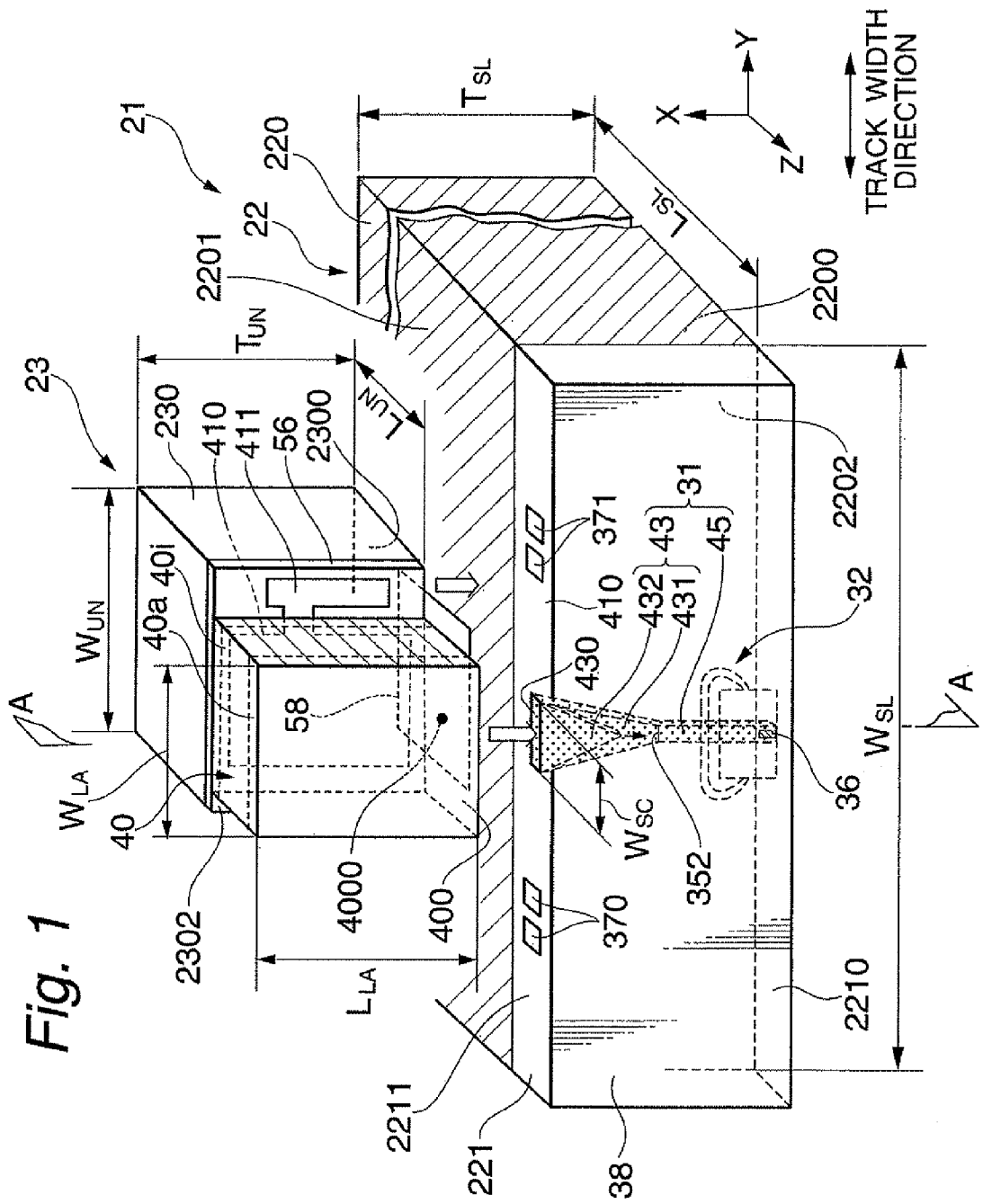
FIG. 1 shows a perspective view illustrating one embodiment of a thermally-assisted magnetic recording head according to the present invention.

FIG. 1 shows a perspective view illustrating one embodiment of a thermally-assisted magnetic recording head according to the present invention.

As shown in FIG. 1, a thermally-assisted magnetic recording head 21 is fabricated by aligning and joining a light source unit 23, which includes a laser diode 40 as a light source for thermal assist, and a slider 22, which includes an optical system 31.

The slider 22 includes: a slider substrate 220 having an air bearing surface (ABS) 2200 processed so as to provide an appropriate flying height; and a head element part 221 that includes an optical system 31 and is formed on an element-integration surface 2202 that is perpendicular to and adjacent to the ABS 2200. While, the light source unit 23 includes: a unit substrate 230 having an joining surface 2300; and a laser diode 40 as a light source provided on a source-installation surface 2302 that is perpendicular to and adjacent to the joining surface 2300.

These slider 22 and light source unit 23 are bonded to each other in such a way that a slider back surface 2201 of the slider substrate 220 on the side opposite to the ABS 2200 and a joining surface 2300 of the unit substrate 230 are opposed to each other and sandwich a solder layer 58 as an adhesion layer therebetween.

(Light Source Unit)

In the light source unit 23 as also shown in FIG. 1, the laser diode 40 can be a semiconductor diode of edge-emitting type. The laser diode 40 has a light-emission center 4000 from which laser light for thermal assist is emitted. The laser diode 40 is provided in the source-installation surface 2302 of the unit substrate 230 in such a way that the light-emission center 4000 is opposed to the light-receiving end surface 430 of a spot-size converter 43. The laser diode 40 is preferably bonded to the unit substrate 230 with a p-electrode layer 40i (FIG. 2) down (so that the p-electrode layer 40i faces the source-installation surface 2302). In edge-emitting laser diodes in general, an active layer (light-emission center) and its vicinity where most amount of heat is generated lie closer to the p-electrode. Therefore, by setting the p-electrode 40i as a bottom, the active layer becomes closer to the unit substrate 230 and thus the unit substrate 230 can more effectively function as a heatsink of the light source.

In this case of setting the laser diode 40 with the p-electrode 40i as a bottom, the upper surface of the laser diode 40 is a surface of an n-electrode 40a (FIG. 2) as an upper electrode. In a burn-in test of the laser diodes 40 as will be detailed later, a sheet-type probe is brought into contact with the n-electrode 40a.

Referring again to FIG. 1, a light source electrode 410 and a lead electrode 411 are provided in a source-installation surface 2302 of the light source unit 23. The light source electrode 410 is to be directly electrically connected to a p-electrode 40i (FIG. 2) of the laser diode 40. The lead electrode 411 is led from the light source electrode 410, and is made contact with the sheet-type probe in a burn-in test of the laser diodes 40 as will be detailed later. Therefore, the surface roughness Ra of the lead electrode 411 as a lower electrode is set or adjusted to be smaller than the surface roughness Ra of the n-electrode 40a as an upper electrode. The lead electrode 411 and the n-electrode 40a of the laser diode 40 will be electrically connected to connection pads of a wiring member 203 of a head gimbal assembly (HGA) 17 (FIG. 5) by a method such as wire bonding or solder ball bonding (SBB), thereby electric power can be supplied to the laser diode 40.

Preferably, an insulation layer 56 of an insulating material such as $Al_2O_3$ (alumina) or $SiO_2$ is provided on the source-installation surface 2302, and on the insulation layer 56, the light source electrode 410 and the lead electrode 411 are provided, thereby electrically insulating the light source electrode 410 and the lead electrode 411 from the unit substrate 230. The light source electrode 410 and the lead electrode 411 may include: a foundation layer made of a material such as Ta or Ti and having a thickness of approximately 10 nm (nanometers) by using sputtering, evaporation, or the like, for example; and a conductor layer of a conductive material such as Au, Cu or an Au alloy formed on the foundation layer with a thickness in the range of approximately 1 to 5 μm (micrometers) by using sputtering, plating, evaporation, or the like, for example.

Referring also to FIG. 1, the unit substrate 230 is preferably made of a ceramic material such as AlTiC ($Al_2O_3$—TiC) or $SiO_2$ or made of a semiconductor material such as Si, GaAs or SiC. In the case that the unit substrate 230 is made of such a semiconductor material, the solder layer 58 can be melted by irradiating the solder layer 58 with a light such as Nd—YAG laser light in such a manner that the unit substrate 230 transmits the light, thereby the light source unit 23 and the slider 22 are bonded to each other.

Further, the unit substrate 230 is somewhat smaller than the slider substrate 220. However, the width $W_{UN}$ of the unit substrate 230 in the track width direction (Y-axis direction) is larger than the width $W_{LA}$ of the laser diode 40 in the track width direction (Y-axis direction), so that the lead electrode 411 is exposed in the source-installation surface 2302 even after the laser diode 40 is mounted on the light-source electrode 410. In the case of using a Femto slider as the slider substrate 220, for example, the unit substrate 230 may have a thickness $T_{UN}$ (in X-axis direction) of 320 μm, a width $W_{UN}$ in the track width direction of 350 μm, and a length $L_{UN}$ (in Z-axis direction) of 250 μm.

(Slider)

In the slider 22 as also shown in FIG. 1, the head element part 221 formed on the element-integration surface 2202 includes: a head element 32 constituted of a magnetoresistive (MR) element 33 for reading data from the magnetic disk 10 (FIG. 4) and an electromagnetic transducer 34 for writing data to the magnetic disk 10; a spot-size converter 43 that receives a laser light emitted from the laser diode 40, changes (reduces) the spot size of the laser light, then guides the laser light into the waveguide 35; a waveguide 35 that guides the laser light with changed spot size to the head end surface 2210 as an opposed-to-medium surface or its vicinity; a near-field light (NF-light) generator 36 that generates NF-light for thermal assist by coupling with the laser light propagating the waveguide 35; and an overcoat layer 38 formed on the element-integration surface 2202 so as to cover the head element 32, the spot-size converter 43, the waveguide 35 and the NF-light generator 36. Here, the spot-size converter 43, the waveguide 35 and the NF-light generator 36 constitute the optical system 31 for generating NF-light in the head 21 (head element part 221). The spot-size converter 43 and waveguide 35 are covered with the overcoat layer 38, and functions as a core in light propagation, whereas the portion of overcoat layer 38 that covers them functions as a clad.

One ends of the MR element 33, the electromagnetic transducer 34 and the NF-light generator 36 reach the head end surface 2210 as an opposed-to-medium surface. Here, the head end surface 2210 and the ABS 2200 constitute the whole opposed-to-medium surface of the thermally-assisted magnetic recording head 21. During actual write and read operations, the thermally-assisted magnetic recording head 21 aerodynamically flies above the surface of the rotating magnetic disk 10 with a predetermined flying height. Thus, the ends of the MR element 33 and electromagnetic transducer 34 face the surface of the magnetic record layer of the magnetic disk 10 with a appropriate magnetic spacing. Then, MR element 33 reads data by sensing signal magnetic field from the magnetic record layer, and the electromagnetic transducer 34 writes data by applying signal magnetic field to the magnetic record layer. When writing data, laser light, which is generated from the laser diode 40 of the light source unit 23 and propagates through the spot-size converter 43 and the waveguide 35, is changed into NF-light NF (FIG. 3) in the NF-light generator 36. Then, a portion to be written of the magnetic recording layer is irradiated and thus heated with the NF-light 62. As a result, the anisotropic magnetic field (coercive force) of the portion is decreased to a value that enables writing; thus the thermally-assisted magnetic recording can be achieved by applying write field with use of the electromagnetic transducer 34 to the anisotropic-field-decreased portion.

Referring also to FIG. 1, the spot-size converter 43 is an optical element which receives laser light emitted from the laser diode 40 at its light-receiving end surface 430 having a width $W_{SC}$ in the track width direction (Y-axis direction), converts the laser light to laser light having a smaller spot diameter with a lower loss, and then guides the converted laser light to a light-receiving end surface 352 of the waveguide 35. The spot-size converter 43 in the present embodiment includes a lower propagation layer 431 and an upper propagation layer 432. The lower propagation layer 431 has a width in the track width direction (Y-axis direction) that gradually decreases from the width $W_{SC}$ along the traveling direction (—X direction) of laser light incident through the light-receiving end surface 430. The upper propagation layer 432 is stacked on the lower propagation layer 431 and has a width in the track width direction (Y-axis direction) that more steeply decreases from the width $W_{SC}$ along the traveling direction (—X direction) of laser light than the lower propagation layer 431. Laser light incident through the light-receiving end surface 430 is converted to laser light with a smaller spot size as the laser light propagates through the layered structure, and reaches the light-receiving end surface 352 of the waveguide 35.

The width $W_{SC}$ of the spot-size converter 43 at the light-receiving end surface 430 may be in the range of approximately 1 to 10 μm, for example. The spot-size converter 43 is made of a material with a refractive index higher than the refractive index $n_{OC}$ of the constituent material of the surrounding overcoat layer 38. The spot-size converter 43 can be formed from the same dielectric material as the waveguide 35, which will be described below. In the case, the spot-size converter 43 and the waveguide 35 may be formed integrally.

The waveguide 35 in the present embodiment extends in parallel with the element-integration surface 2202 from the light-receiving end surface 352 that receives laser light emitted from the spot-size converter 43 to the end surface 350 on the head end surface 2210 side. Here, the end surface 350 may be a portion of the head end surface 2210, or may be recessed from the head end surface 2210 with a predetermined distance. A portion of one side surface of the waveguide 35 near the end surface 350 faces a NF-light generator 36. This allows laser light (waveguide light) incident through the light-receiving end surface 352 and traveling through the waveguide 35 to reach the portion facing the NF-light generator 36, thereby to be coupled with the generator 36.

Referring again to FIG. 1, a pair of terminal electrodes 370 and a pair of terminal electrodes 371 for the magnetic head element 32 are provided on the upper surface of the overcoat layer 38 of the slider 22. The terminal electrodes 370 and 371 are electrically connected to connection pads of wiring members provided in an HGA 17 (FIG. 5) by wire bonding method or SBB method. A mode of the connection between these terminal electrodes and the wiring members on the flexure 201 will also be described later in detail.

The slider substrate 220 may be, for example, a so-called Femto slider having a thickness (in X-axis direction) $T_{SL}$ of 230 μm, a width $W_{SL}$, of 700 μm in the track width direction (Y-axis direction), and a length $L_{SL}$, (in Z-axis direction) of 850 μm. The Femto slider is generally used as a substrate for thin-film magnetic heads capable of high-density recording, and has the smallest standardized size of all the sliders currently on the market. The slider substrate 220 can be formed of a ceramic material such as AlTiC ($Al_2O_3$—TiC) or $SiO_2$.

(Thermally-Assisted Magnetic Recording Head)

As described above, the thermally-assisted magnetic recording head 21 has a "composite slider structure" in which the slider 22 and the light source unit 23 are bonded to be joined. Thus, the slider 22 and the light source unit 23 can be separately fabricated and then joined together to fabricate the head 21. Consequently, if performance and reliability evaluations of the light source units 23 are performed prior to the fabrication of the heads and only good light source units 23 are used for the fabrication of the heads, significantly adverse influence to the production yield of heads 21 in the head manufacturing process due to the rejection rates of light-source units 23 can be avoided.

Here, characteristic of emitting operation of the laser diode 40, especially, stability over time of the characteristic significantly affects the evaluation of the light source units 23. By checking such a characteristic on the upstream of the manufacturing process, which greatly affects the manufacturing yield, and screening the light source unit 23, the degradation of manufacturing yield for obtaining the whole heads 21 can be avoided. According to the present invention, a burn-in test can be implemented stably and economically (in large quantities at one time), which provides reliability evaluation that is important for screening the light source units 23, especially evaluation of stability over time of the laser diode 40.

Figure 2:
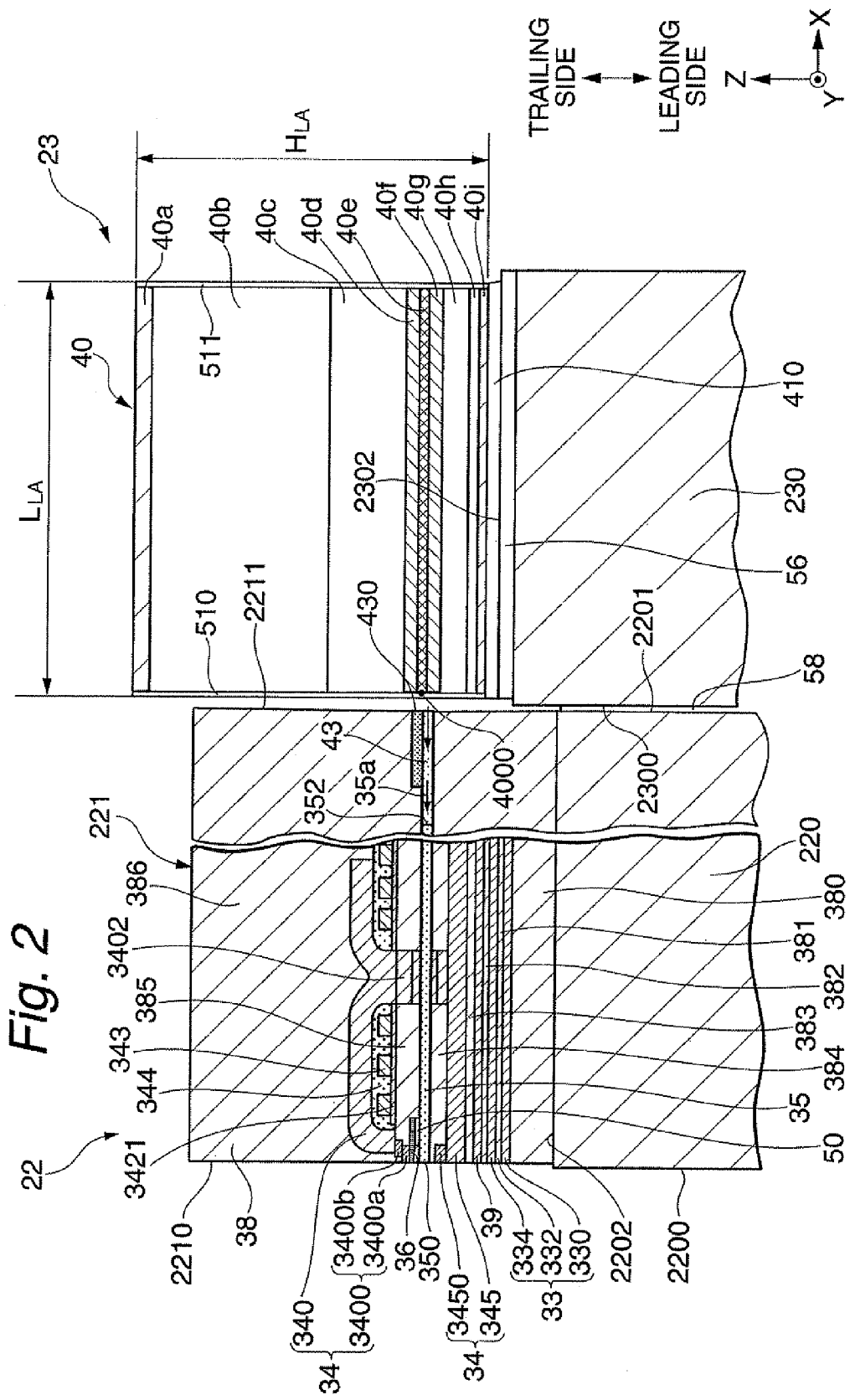
FIG. 2 shows a cross-sectional view taken by plane A in FIG. 1, schematically illustrating the structures of the head element part of the slider, the laser diode of the light source unit, and their vicinities in the thermally-assisted magnetic recording head.

FIG. 2 shows a cross-sectional view taken by plane A in FIG. 1, schematically illustrating the structures of the head element part 221 of the slider 22, the laser diode 40 of the light source unit 23, and their vicinities in the thermally-assisted magnetic recording head 21.

(Laser Diode)

According to FIG. 2, the laser diode 40 is of edge-emitting type. As the laser diode 40, InP base, GaAs base or GaN base diodes can be utilized, which are usually used for communication, optical disk storage, or material analysis. The wavelength $\lambda_L$ of the emitted laser light may be, for example, in the range of approximately 375 nm to 1.7 μm. The laser diode 40 shown in FIG. 2 has a multilayered structure in which, from the upper surface side, sequentially stacked is: an n-electrode 40a; an n-GaAs substrate 40b; an n-InGaAlP clad layer 40c; the first InGaAlP guide layer 40d; an active layer 40e formed of multiquantum well (InGaP/InGaAlP) or the like; the second InGaAlP guide layer 40f; an p-InGaAlP clad layer 40g; a p-electrode base layer 40h; and a p-electrode 40i. Further, on the front and rear cleaved surfaces of the multilayered structure of the laser diode 40, respectively formed are reflective layers 510 and 511 for exciting the oscillation by total reflection. Here, the light-emission center 4000 exists at the position of the active layer 40e on the reflective layer 510. In the present embodiment, the n-electrode 40a can be a layer made of, for example, Au or Au alloy with a thickness of approximately 0.1 μm and formed on the n-GaAs substrate 40b.

Of course, the structure of the laser diode 40 is not limited to the above-described one. However, the laser diode 40 is preferably disposed in such a manner that the p-electrode 40i is positioned at the bottom and is bonded to the light-source electrode 410. In edge-emitting laser diodes in general, the active layer 40e (light-emission center 4000) is closer to the p-electrode 40i than the n-electrode 40a in the direction in which the layers are stacked (in Z-axis direction). Accordingly, by setting the laser diode 40 with its p-electrode 40i as a bottom, the p-electrode 40i being closer to the active layer 40e that generates most amount of heat during operation, the unit substrate 230 can more effectively function as a heatsink of the light source. In fact, the appropriate disposal of heat generated from the laser diode 40 is very important for maintaining the operations of the laser diode 40 and the other elements within the head in good working order.

Further, an electric source provided within the magnetic disk apparatus can be used for driving the laser diode 40. In fact, the magnetic disk drive apparatus usually has an electric source with applying voltage of, for example, approximately 2 to 5V, which is sufficient for the laser oscillation. The laser diode 40 may have a width $W_{LA}$, (FIG. 1) in the track width direction (in Y-axis direction) in the range from 150 to 250 μm, for example. The length $L_{LA}$ of the laser diode 40 corresponds approximately to a cavity length that is the distance between the reflective layers 510 and 511, and is preferably 300 μm or more. Further, the height $H_{LA}$ of the laser diode 40 is preferably set to be in the range from 40 to 100 μm. The height $H_{LA}$ is equivalent to the difference in height (in Z-axis direction) between the n-electrode 40a and the lead electrode 411. In performing burn-in test described later in which electrodes have such a difference in height, stable contact between sheet-type probes and the electrodes can be obtained and thus good burn-in test can be implemented by relatively adjusting the surface roughness Ra of the electrodes that is to be made contact with the sheet-type probe.

Referring also to FIG. 2, the p-electrode layer 40i of the laser diode 40 and the light-source electrode 410 of the unit substrate 230 can be bonded to each other by soldering using one of lead-free solders such as Au—Sn alloy. Further, the slider 22 and the light source unit 23 are bonded to each other in such a way that the back surface 2201 of the slider substrate 220 and the joining surface 2300 of the unit substrate 230 are opposed to each other and sandwich a solder layer 58 as an adhesion layer therebetween. If the unit substrate 230 is made of a semiconductor material such as Si, GaAs or SiC, the solder layer 58 can be melted by irradiation with light such as Nd—YAG laser light that propagates through the unit substrate 230, while joining the light source unit 23 and the slider 22 with the solder layer 58 made of AuSn alloy, for example.

(Head Element Part)

As shown also in FIG. 2, the head element part 221 includes an MR element 33 and an electromagnetic transducer 34 and an optical system 31.

The MR element 33 is formed on a base layer 380 that is formed of an insulating material such as $Al_2O_3$ (alumina), $SiO_2$ and stacked on the element-integration surface 2202. The MR element 33 includes: an MR multilayer 332; and a lower shield layer 330 and an upper shield layer 334 which are formed of a soft-magnetic material and sandwich the MR multilayer 332 and an insulating layer 381 therebetween. The MR multilayer 332 is a magneto-sensitive part for detecting signal magnetic field by utilizing MR effect. The MR multilayer 332 may be, for example: a current-in-plane giant magnetoresistive (CIP-GMR) multilayer that utilizes CIP-GMR effect; a current-perpendicular-to-plane giant magnetoresistive (CPP-GMR) multilayer that utilizes CPP-GMR effect; or a tunnel magnetoresistive (TMR) multilayer that utilizes TMR effect.

The electromagnetic transducer 34 is designed for perpendicular magnetic recording, and includes an upper yoke layer 340, a main magnetic pole 3400, a write coil layer 343, a coil-insulating layer 344, a lower yoke layer 345, and a lower shield 3450.

The upper yoke layer 340 is formed so as to cover the coil-insulating layer 344, and the main magnetic pole 3400 is formed on an insulating layer 385 made of an insulating material such as $Al_2O_3$ (alumina). These upper yoke layer 340 and main magnetic pole 3400 are magnetically connected with each other, and acts as a magnetic path for converging and guiding magnetic flux toward the magnetic recording layer (perpendicular magnetization layer) of the magnetic disk 10 (FIG. 4), the magnetic flux being excited by write current flowing through the write coil layer 343. The main magnetic pole 3400 includes: a first main pole portion 3400a reaching the head end surface 2210 and having a small width $W_P$ (FIG. 3) in the track width direction; and a second main pole portion 3400b located on the first main pole portion 3400a and at the rear (+X side) of the portion 3400a. Here, the above-described width $W_P$ is the length of an edge in the track width direction (Y-axis direction) of the end surface 3400e (FIG. 3) on the head end surface 2210, and defines the width of write field distribution in the track width direction (Y-axis direction). The width $W_P$ can be set to be, for example, 0.05 to 0.5 μm. The main magnetic pole 3400 is preferably formed of a soft-magnetic material with a saturation magnetic flux density higher than that of the upper yoke layer 340, which is, for example, an iron alloy containing Fe as a main component.

The write coil layer 343 is formed on an insulating layer 385 made of an insulating material such as $Al_2O_3$ (alumina), in such a way as to pass through in one turn at least between the lower yoke layer 345 and the upper yoke layer 340, and has a spiral structure with a back contact portion 3402 as a center. The write coil layer 343 is formed of a conductive material such as Cu (copper). The write coil layer 343 is covered with a coil-insulating layer 344 that is formed of an insulating material such as a heat-cured photoresist and electrically isolates the write coil layer 343 from the upper yoke layer 340. The write coil layer 343 has a monolayer structure in the present embodiment; however, may have a two or more layered structure or a helical coil shape. Further, the number of turns of the write coil layer 343 is not limited to that shown in FIG. 2, and may be, for example, in the range from two to seven.

The back contact portion 3402 has a though-hole extending in X-axis direction, and the waveguide 35 and insulating layers that covers the waveguide 35 pass through the though-hole. In the though-hole, the waveguide 35 is away at a predetermined distance of, for example, at least 1 μm from the inner wall of the back contact portion 3402. The distance prevents the absorption of the waveguide light by the back contact portion 3402.

The lower yoke layer 345 is formed on an insulating layer 383 made of an insulating material such as $Al_2O_3$ (alumina), and acts as a magnetic path for the magnetic flux returning from a soft-magnetic under layer that is provided under the magnetic recording layer (perpendicular magnetization layer) of the magnetic disk 10. The lower yoke layer 345 is formed of a soft-magnetic material. Further, the lower shield 3450 is a part of the magnetic path, being connected with the lower yoke layer 345 and reaching the head end surface 2210.

The lower shield 3450 is opposed to the main magnetic pole 3400 through the NF-light generator 36, and acts for receiving the magnetic flux spreading from the main magnetic pole 3400. The lower shield 3450 is preferably formed of a material with high saturation magnetic flux density such as NiFe (Permalloy) or an iron alloy as the main magnetic pole 3400 is formed of.

Referring also to FIG. 2, the optical system 31 includes a spot-size converter 43, a waveguide 35 and a NF-light generator 36.

Laser light 53a, the spot size of which the spot-size converter 43 changes (reduces), enters the waveguide 35 from the light-receiving end surface 352, and propagates through the waveguide 35. The waveguide 35 extends from the light-receiving end surface 352 to the end surface 350 on the head end surface 2210 side through the through-hole that is provided in the back contact portion 3402 and extends in X-axis direction. Furthermore, the NF-light generator 36 is an element that transforms the laser light (waveguide light) propagating through the waveguide 35 into NF-light. A part on the head end surface 2210 side of the waveguide 35 and the NF-light generator 36 are provided between the lower shield 3450 (lower yoke layer 345) and the main magnetic pole 3400 (upper yoke layer 340). Further, a portion of the upper surface (side surface) of the waveguide 35 on the head end surface 2210 side is opposed to a portion of the lower surface of the NF-light generator 36 with a predetermined distance. The sandwiched portion between these portions constitutes a buffering portion 50 having a refractive index lower than that of the waveguide 35. The buffering portion 50 acts for coupling the laser light (waveguide light) that propagates through the waveguide 35 with the NF-light generator 36. A detailed explanation of the waveguide 35, the buffering portion 50 and the NF-light generator 36 will be given later with reference to FIG. 3.

Further, also as shown in FIG. 2, an inter-element shield layer 39 is preferably provided between the MR element 33 and the electromagnetic transducer 34 (lower yoke layer 345), sandwiched by the insulating layers 382 and 383. The inter-element shield layer 39 plays a role for shielding the MR element 33 from the magnetic field generated from the electromagnetic transducer 34, and may be formed of a soft-magnetic material. Here, the above-described insulating layers 381, 382, 383, 384, 385 and 386 constitute the overcoat layer 38.

Figure 3:
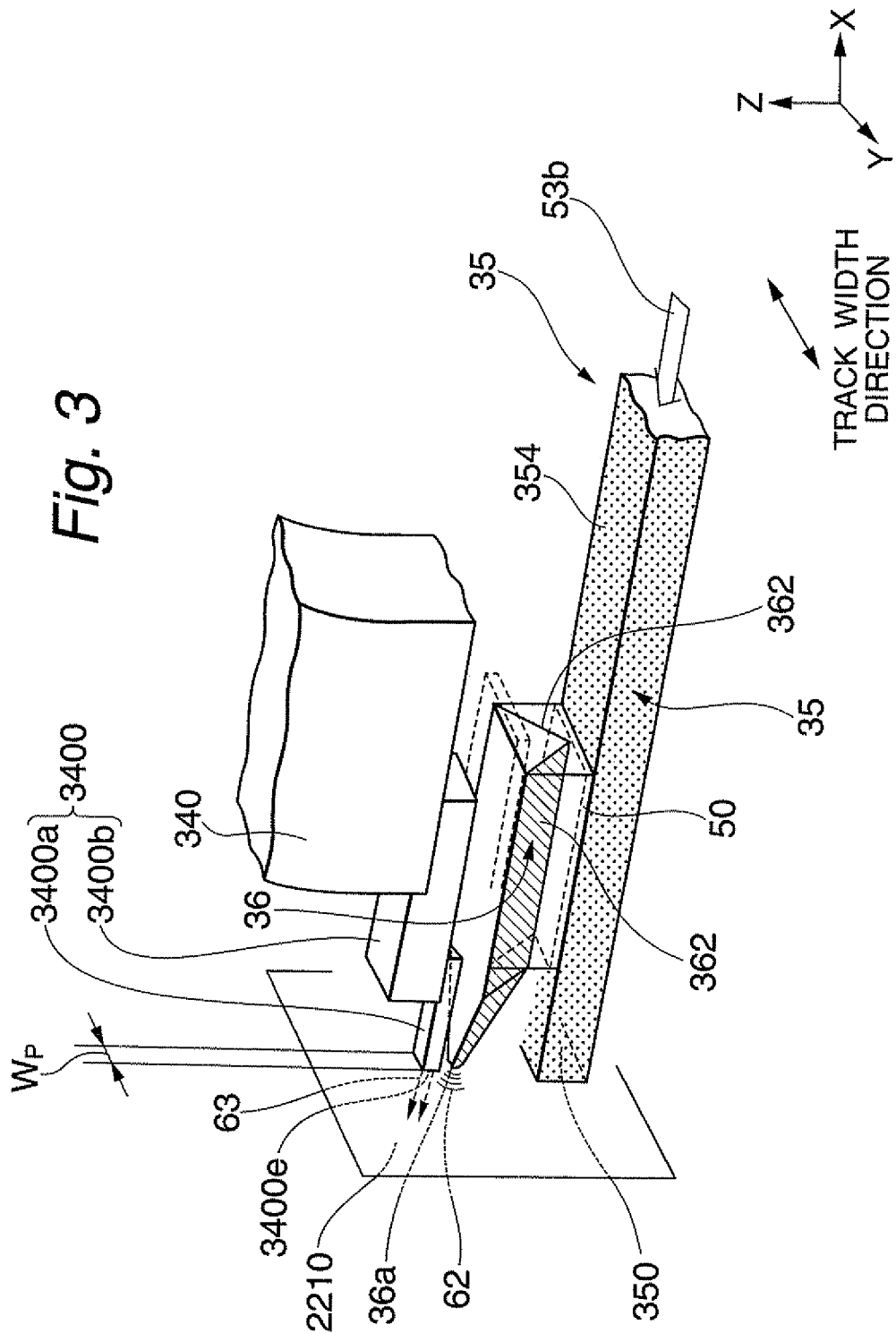
FIG. 3 shows a perspective view schematically illustrating the configuration of the waveguide, the NF-light generator and the main magnetic pole.

FIG. 3 shows a perspective view schematically illustrating the configuration of the waveguide 35, the NF-light generator 36 and the main magnetic pole 3400. In the figure, the head end surface 2210 is positioned at the left side, the surface 2210 including positions where write field and NF-light are emitted toward the magnetic recording medium.

As shown in FIG. 3, the configuration includes the waveguide 35 for propagating laser light (waveguide light) 53b used for generating NF-light toward the end surface 350, and the NF-light generator 36 that receives the waveguide light 53b and generates NF-light 63. Further, a buffering portion 50 is a portion sandwiched between a portion of the side surface 354 of the waveguide 35 and a portion of the lower surface 362 of the NF-light generator 36. The buffering portion 50 is formed of, for example, a dielectric material that has a refractive index lower than that of the waveguide 35, and acts for coupling the waveguide light 53b with the Nf-light generator 36. In the light source and optical system as shown in FIGS. 1 to 3, the laser light emitted from the light-emission surface 400 of the laser diode 40 preferably has TM-mode polarization in which the oscillation direction of electric field of the laser light is along Z-axis.

Further, as also shown in FIG. 3, the NF-light generator 36 is, in the present embodiment, formed of a metal such as Au, Ag, or an alloy including Au or Ag, and has a cross-section taken by YZ-plane with a triangular shape. The end surface 36a, which reaches the head end surface 2210, especially has an isosceles triangle shape that has one apex on the leading side (−Z side) opposed to the bottom edge. The NF-light generator 36 receives the waveguide light 53b through the buffering portion 50, and emits NF-light 62 from the end surface 36a. The NF-light 62 is emitted toward the magnetic recording layer of the magnetic disk 10 (FIG. 4), and reaches the surface of the magnetic disk 10 to heat a portion of the magnetic recording layer of the disk 10. This heating reduces the anisotropic magnetic field (coercive force) of the portion to a value with which write operation can be performed. Immediately after the heating, write field 63 generated from the main magnetic pole 3400 is applied to the portion to perform write operation. Thus, the thermally-assisted magnetic recording can be accomplished.

The optical system that is provided in the head element part 221 and generates light for thermal assist is not limited to the above-described one. For example, as an alternative, there can be available an optical system that use a NF-light generator having another shape and structure, or an optical system in which a plasmon antenna made of a metal piece is provided at the end of a waveguide.

Figure 4:
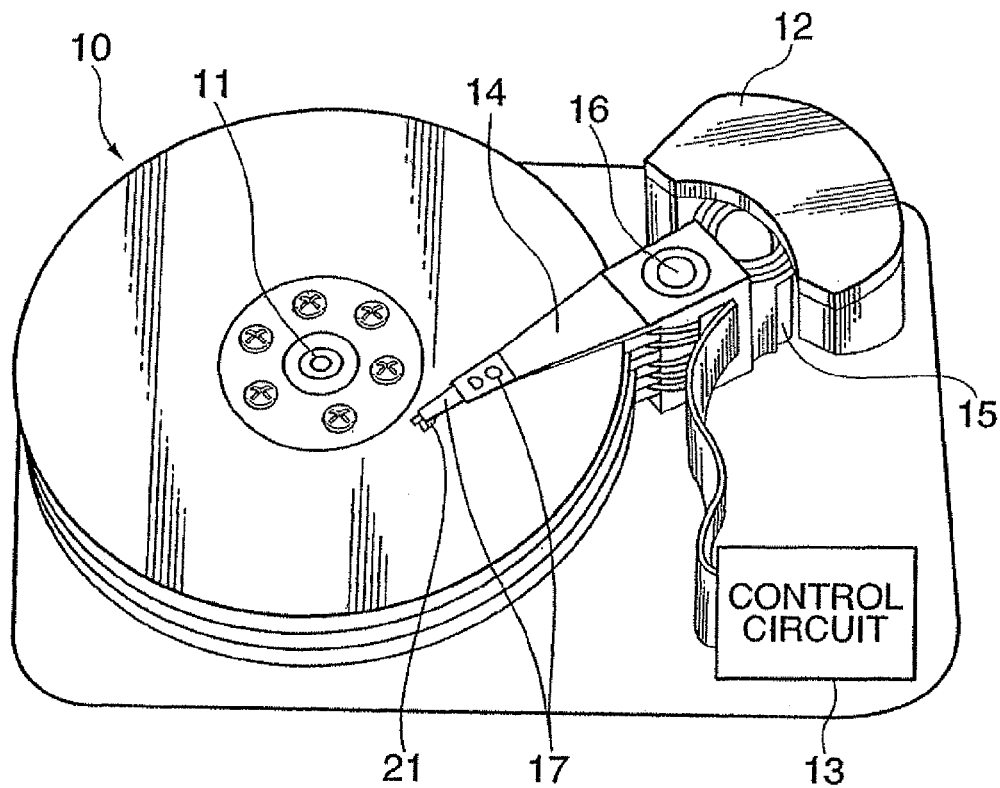
FIG. 4 shows a perspective view schematically illustrating a structure of a major part in one embodiment of a magnetic disk apparatus according to the present invention.
Figure 5:
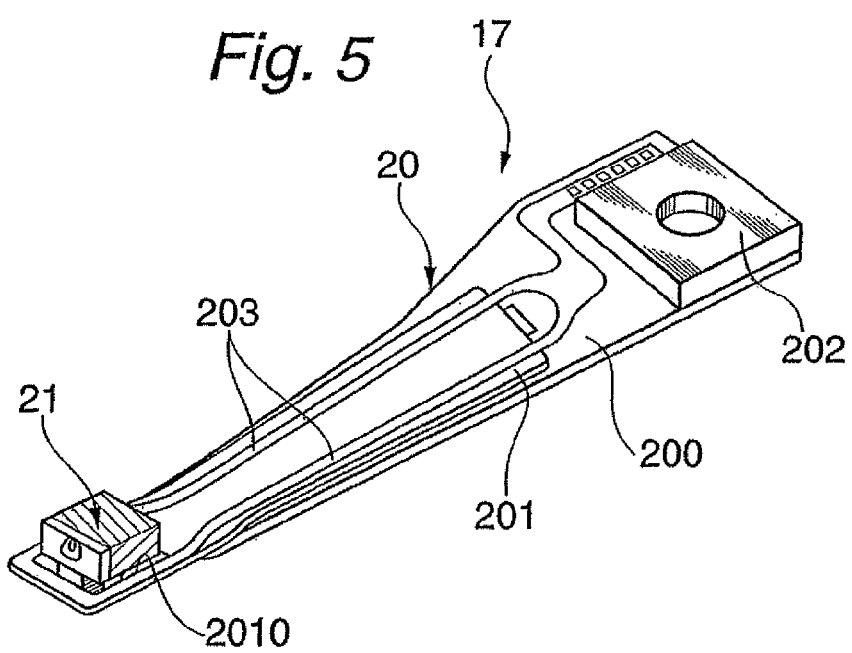
FIG. 5 shows a perspective view schematically illustrating a structure of a major part in one embodiment of a head gimbal assembly (HGA) according to the present invention.

FIG. 4 shows a perspective view schematically illustrating a structure of a major part in one embodiment of a magnetic disk apparatus according to the present invention. FIG. 5 shows a perspective view schematically illustrating a structure of a major part in one embodiment of an HGA according to the present invention. In FIG. 5, the side of the HGA opposed to the surface of the magnetic disk is presented as the upper side.

A magnetic disk apparatus as a magnetic recording apparatus shown in FIG. 4 includes: a plurality of magnetic disks 10 rotating around a rotational axis of a spindle motor 11; an assembly carriage device 12 provided with a plurality of drive arms 14 thereon; an HGA 17 attached on the top end portion of each drive arm 14 and provided with a thermally-assisted magnetic recording head 21; and a recording/reproducing and light-emission control circuit 13 for controlling write/read operations of the thermally-assisted magnetic recording head 21 and further for controlling the emission operation of a laser diode 40 as a light source that generates laser light for thermally-assisted magnetic recording.

The magnetic disk 10 is, in the present embodiment, designed for perpendicular magnetic recording, and has a structure in which, for example, sequentially stacked on a disk substrate is: a soft-magnetic under layer; an intermediate layer; and a magnetic recording layer (perpendicular magnetization layer). The assembly carriage device 12 is a device for positioning the thermally-assisted magnetic recording head 21 above a track formed on the magnetic recording layer of the magnetic disk 10, on which recording bits are aligned. In the apparatus, the drive arms 14 are stacked in a direction along a pivot bearing axis 16 and can be angularly swung around the axis 16 by a voice coil motor (VCM) 15. The structure of the magnetic disk apparatus according to the present invention is not limited to that described above. For instance, the number of each of magnetic disks 10, drive arms 14, HGAs 17 and sliders 21 may be one.

Referring to FIG. 5, a suspension 20 in the HGA 17 includes a load beam 200, a flexure 201 with elasticity fixed to the load beam 200, a base plate 202 provided on the base portion of the load beam 200, and a wiring member 203 provided on the flexure 201 and made up of lead conductors and connection pads electrically joined to both ends of the lead conductors. The thermally-assisted magnetic recording head 21 is fixed to the flexure 201 at the top end portion of the suspension 20 so as to face the surface of each magnetic disk 10 with a predetermined space (flying height). Here, an aperture 2010 is provided in the flexure 201; the thermally-assisted magnetic recording head 21 is fixed in such a way that the light source unit 23 protrudes from the opposite side of the flexure 201 through the aperture 2010.

Connection pads, which form one end of the wiring member 203, are electrically connected to terminal electrodes 370 and 371 (FIG. 1) for the magnetic head element 32 of the thermally-assisted magnetic recording head 21, and further to the lead electrode 411 of the light source unit 23 and the n-electrode 40a (FIG. 1) of the of the laser diode 40, by using wire bonding, SBB or the like. These connections enable the MR element 33, the electromagnetic transducer and the laser diode 40 to be powered and driven. The structure of the suspension 20 is not limited to the above-described one. An IC chip for driving the head may be mounted midway on the suspension 20, though not shown.

Figure 8:
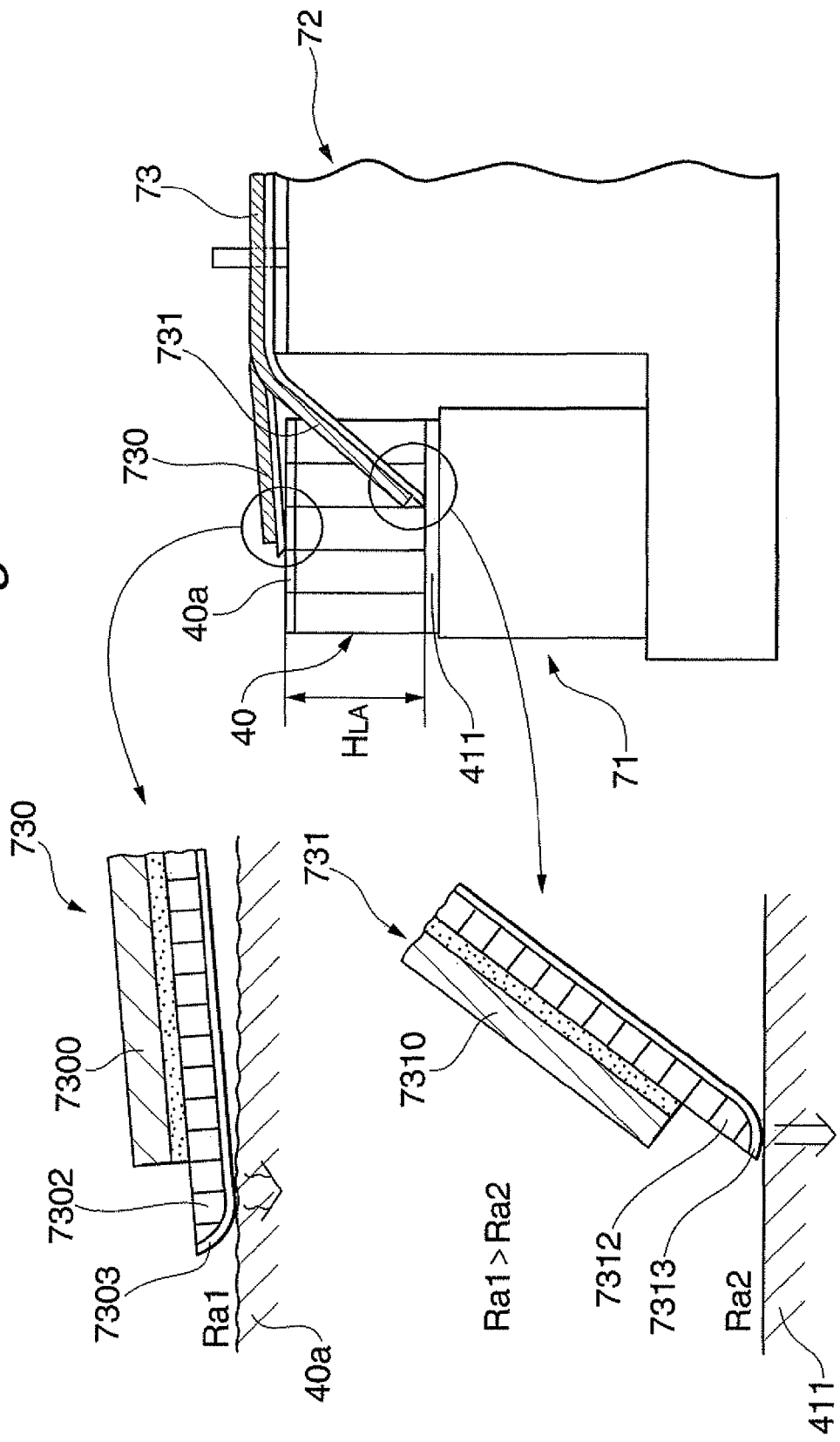
FIG. 8 shows schematic diagrams illustrating how the sheet-type probes used in the burn-in test makes contact with electrodes.
Figure 9:
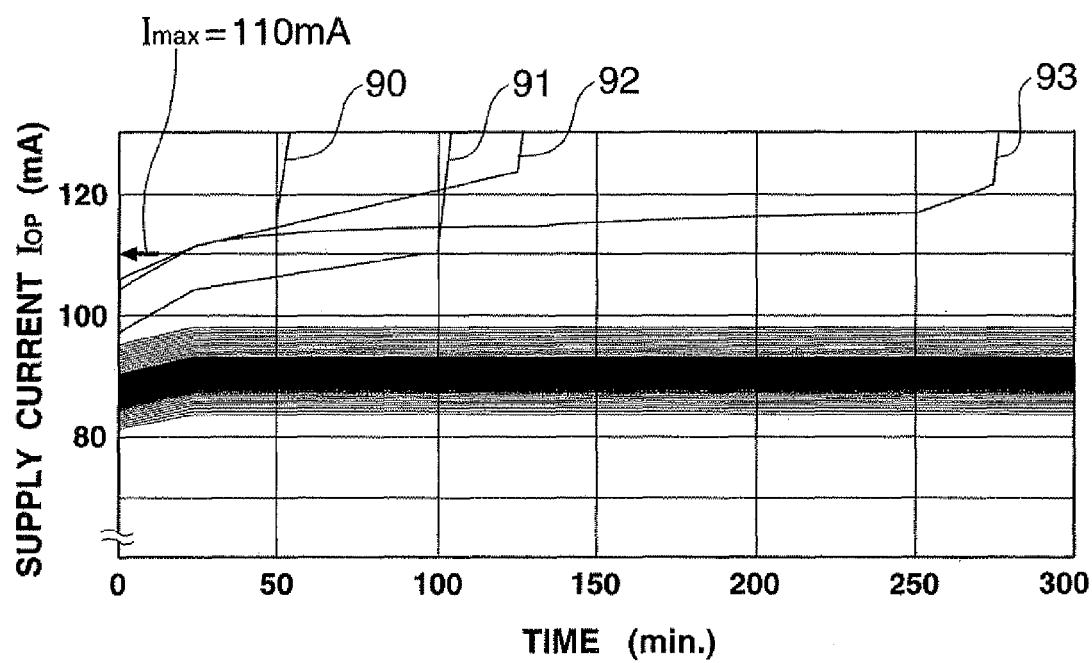
FIG. 9 shows a graph of changes over time in electric current applied to a laser diode in practical examples in which burn-in tests were conducted on a light-source-unit bar.

FIGS. 6a to 6f show perspective views schematically illustrating one embodiment of a method for manufacturing a light source unit 23 that involves screening by burn-in test of the light source unit 23 according to the present invention. FIGS. 7a and 7b show a cross-sectional view and a bottom view of a structure of sheet-type probes used in the burn-in test. FIG. 7b is a bottom view viewed from the side that contacts an electrode. FIG. 8 shows schematic diagrams illustrating how the sheet-type probes used in the burn-in test makes contact with electrodes. FIG. 9 shows a graph of changes over time in electric current applied to a laser diode 40 in practical examples in which burn-in tests were conducted on a light-source-unit bar 71.

Figure 6A:
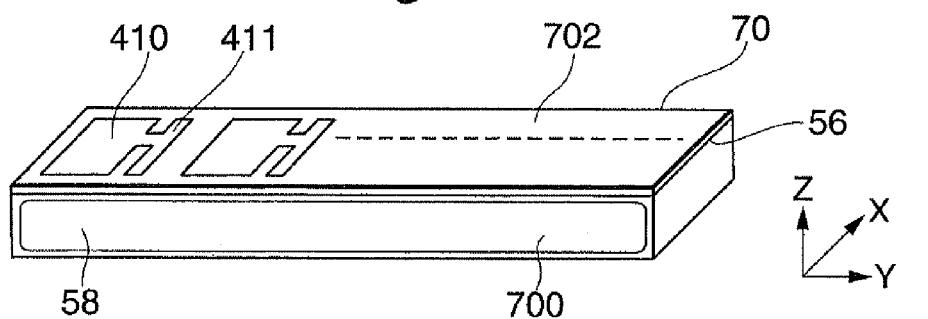
FIGS. 6a to 6f show perspective views schematically illustrating one embodiment of a method for manufacturing a light source unit that involves screening by burn-in test of the light source unit according to the present invention.

According to the embodiment illustrated in FIG. 6a, multiple sets of light-source electrode 410 and lead electrode 411 are formed on a source-installation surface 702 of a bar substrate 70 by sputtering, plating, or vapor-deposition, and photolithography, milling and so on, for example. Preferably, an insulating layer 56 is formed on the source-installation surface 702 and the electrodes are provided on the insulating layer 56. The bar substrate 70 on which the electrodes are formed can be obtained for example by forming multiple sets of light-source electrode 410 and lead electrode 411 in rows on a wafer and cutting the wafer into bars. The bar substrate 70 is a member to be diced into individual unit substrates 230.

The lead electrodes 411 will make contact with sheet-type probes in a subsequent burn-in test step. Therefore, the surface roughness Ra of the lead electrode 411 is preferably controlled to a value in the range of 0.005 μm to 0.5 μm, inclusive, as will be detailed later. For example, the surface roughness Ra can be controlled by choosing an appropriate deposition method for forming the lead electrodes 411 and by adjusting the conditions under which the deposition is performed. Further, experiments have shown that a surface roughness Ra of the order of 0.1 μm, for example, can be provided by precision grinding of the metal surface of lead electrodes 411. Here, the surface roughness Ra is the arithmetic average roughness Ra defined in Japanese Industrial Standards (JIS) B 0601-2001. The arithmetic average roughness Ra is calculated as follows. A roughness curve (f(x)) is folded along the centerline (along the x-axis) and the area enclosed by the folded roughness curve and the centerline is divided by the length (L) of a region to be measured. The result is expressed in micrometers. That is, $Ra = L^{-1} \int_0^L |f(x)| dx$.

Then, as illustrated in FIG. 6a, a solder layer 58 of Au—Sn alloy, for example, for connecting to slider 22 is formed on a joining surface 700 of the bar substrate 70 by sputtering or vapor evaporation, for example. The solder layer 58 of such metal can be subsequently melted by irradiation with laser light such as Nd—YAG laser light to bond a light source unit 23 to the slider 22.

Figure 6B:
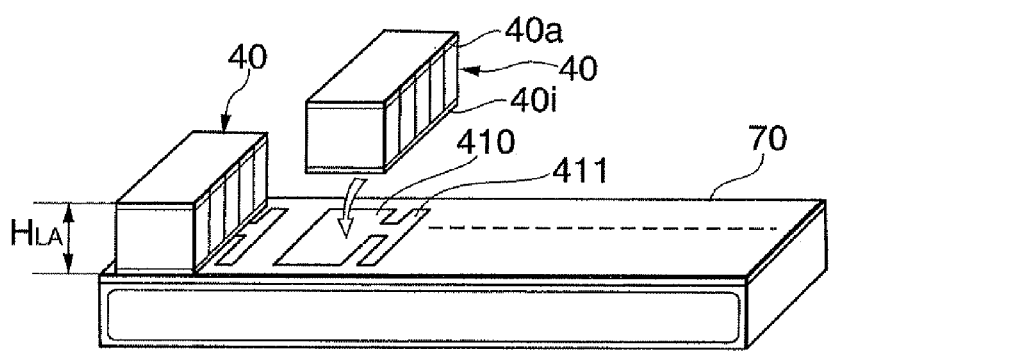

Then, as illustrated in FIG. 6b, each of multiple laser diodes 40 is placed on each light-source electrode 410 in such a manner that the p-electrode 40i of the laser diode 40 faces down. Then the laser diodes 40 are bonded to the light-source electrodes 410. As a result, a light-source-unit bar 71 having multiple light sources provided on the bar substrate 70 is completed. The light-source-unit bar 71 is to be diced into chips which are used as individual light source units 23. Bonding of the laser diode 40 can be accomplished, for example, by depositing a film of a material such as Au—Sn alloy on the light-source electrode 410 beforehand, placing the laser diode 40 on the deposited film (the light-source electrode 410), and then heating them with a hotplate or the like under a hot-air blower to approximately 200 to 300° C.

Here, an n-electrode 40a, which is the upper surface of the laser diode 40 to be mounted, will also make contact with the sheet-type probe in the subsequent burn-in test. Therefore, the surface roughness Ra of the n-electrode 40a, which is an upper electrode, is preferably controlled to a value in the range of 0.5 μm to 10 μm and preferably to a value greater than the surface roughness Ra of the lead electrode 411, which is a lower electrode as described above. The surface roughness Ra of the n-electrode 40a is adjusted as follows. In the laser diode 40, the surface of an n-GaAs substrate 40b (FIG. 2) on which the n-electrode 40a is provided is typically polished by a predetermined polishing process. The surface roughness Ra of the n-electrode 40a can be controlled by using an abrasive with greater grains to grind the surface of the n-GaAs substrate 40b, thus to provide a predetermined roughness that is greater than usual before forming the n-electrode 40a. Typically, the n-electrodes of most laser diodes are smoothed to a great degree in order to enable stable wire-bonding required for mounting the laser diode in a can package, which is a can-shaped protective package. For example, the surface roughness Ra of some n-electrodes is less than 0.5 μm. However, the value of the surface roughness Ra can be increased by applying beforehand the processing described above.

The height $H_{LA}$ of the laser diode 40 to be mounted is chosen to be in the range of 40 μm to 100 μm, inclusive. The range of height $H_{LA}$ includes the heights of edge-emitting laser diode chips which are commonly used for general purposes.

Figure 6C:
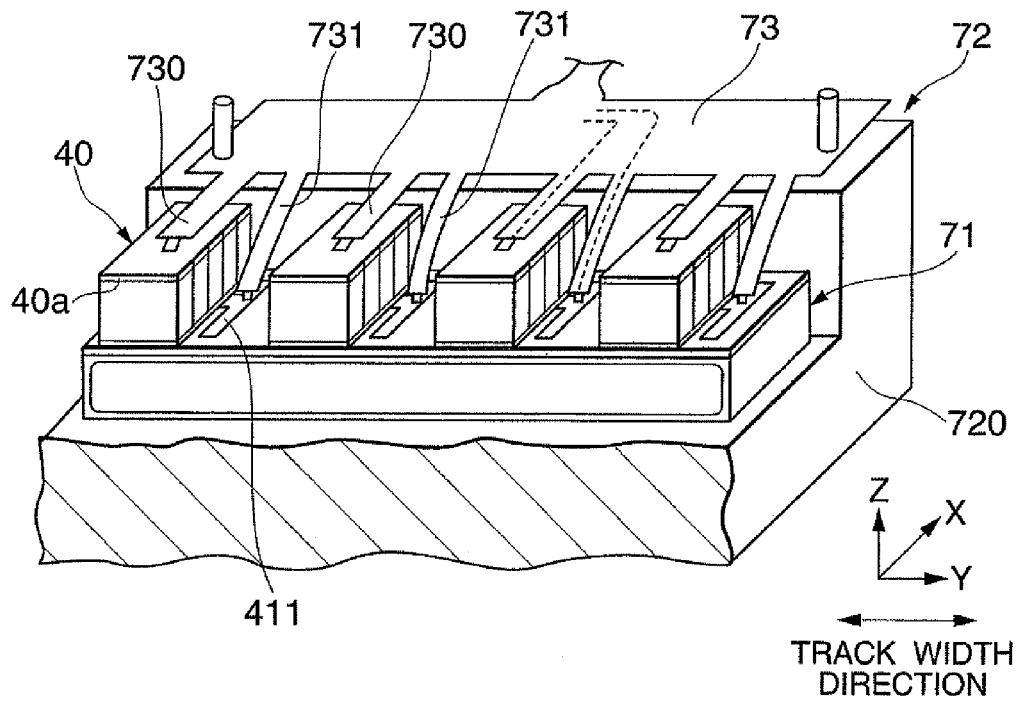

Then, as illustrated in FIG. 6c, the light-source-unit bar 71 prepared and adjusted as described above is set in a holding jig 720 of a burn-in test apparatus 72. The burn-in test apparatus 72 includes a sheet-type probe set 73. The sheet-type probe set 73 includes reed-shaped (strip-shaped) sheet-type probes 730 for n-electrodes 40a and reed-shaped (strip-shaped) sheet-type probes 731 for lead electrodes 411 that are alternately arranged. The sheet-type probes 730 are brought into contact with the n-electrodes 40a on the light-source-unit bar 71 set in the holding jig 720 while the sheet-type probes 731 are brought into contact with the lead electrodes 411. Then, electric current is supplied to the laser diodes 40 through the sheet-type probes 730 and the n-electrodes 40a as well as the sheet-type probes 731 and the lead electrodes 411 to perform burn-in test.

As illustrated in FIGS. 7a and 7b, each of the sheet-type probes 730 (731) includes: a base element 7300 (7310) made of an elastic material such as stainless steel with a thickness of approximately 20 μm, for example; an insulating layer 7301 (7311) of an insulating material such as polyimide with a thickness of approximately 10 μm, formed on the base element 7300 (7310), for example; a conductive layer 7302 (7312) of a conductive material such as Cu with a thickness of approximately 20 μm formed on the insulating layer 7301 (7311), for example; and a conductive overcoat layer 7303 (7313) of a material such as Au or an Au alloy with a thickness of approximately 10 μm by plating to cover the conductive layer 7302 (7312). A portion of the conductive layer 7302 (7312) on the side that contacts the n-electrode 40a (lead electrode 411) protrudes from the base element 7300 (7310). The protruding portion of the conductive layer 7302 (7312) may have a width $W_{CON}$ of approximately 30 μm, for example. The conductive overcoat layer 7303 (7313) covers at least a portion of the conductive layer 7302 that contacts the n-electrode 40a (lead electrode 411). The sheet-type probes 730 and 731 are not limited to the form described above; the sheet-type probes 730 and 731 may have other structure in which a flexible conductive layer appropriately contacts the electrodes.

FIG. 8 illustrates the sheet-type probes 730 and 731 in contact with an n-electrode 40a and a lead electrode 411, respectively. Referring to FIG. 8, the sheet-type probe 730 is in contact with the n-electrode 40a, which is located at a position (level) higher than the lead electrode 411 by a height $H_{LA}$. Here, the "height" of the position of an electrode is a measure of the position of the electrode in Z-axis direction in the present embodiment; the electrode is in a "higher" position than another electrode when the electrode is farther in +Z direction. Accordingly, the conductive layer 7302 (conductive overcoat layer 7303) at the tip of the sheet-type probe 730 makes contact with the n-electrode 40a at a smaller angle than the conductive layer 7312 (conductive overcoat layer 7313) at the tip of the sheet-type probe 731. Here, experiments and experiences have shown that the quality of contact between a sheet-type probe and an electrode in general depends in large part on the angle at which the end of the sheet-type probe makes contact with the electrode. In fact, the conductive layer 7302 (conductive overcoat layer 7303) is in contact with the n-electrode 40a with a shallower angle. Accordingly, the pressure that presses both layers disperses over a broader area of contact between both layers and the contact point is unsettled. Consequently, the contact between both layers is less stable due to the shallow angle.

However, the surface roughness Ra1 of the n-electrode 40a in the present embodiment is higher than the surface roughness Ra2 of the lead electrode 411 described above. Preferably, the surface roughness Ra1 is set to a value in the range of 0.5 to 10 μm when the difference in height $H_{LA}$ between the n-electrode 40a and the lead electrode 411 is in the range of 40 to 100 μm and the surface roughness Ra2 is in the range of 0.005 to 0.5 μm. The setting in the above-described range allows the conductive layer 7302 (conductive overcoat layer 7303) of the sheet-type probe 730, which would otherwise be less stable due to the contact angle, to make contact with the n-electrode 40a more stably.

Figure 6D:
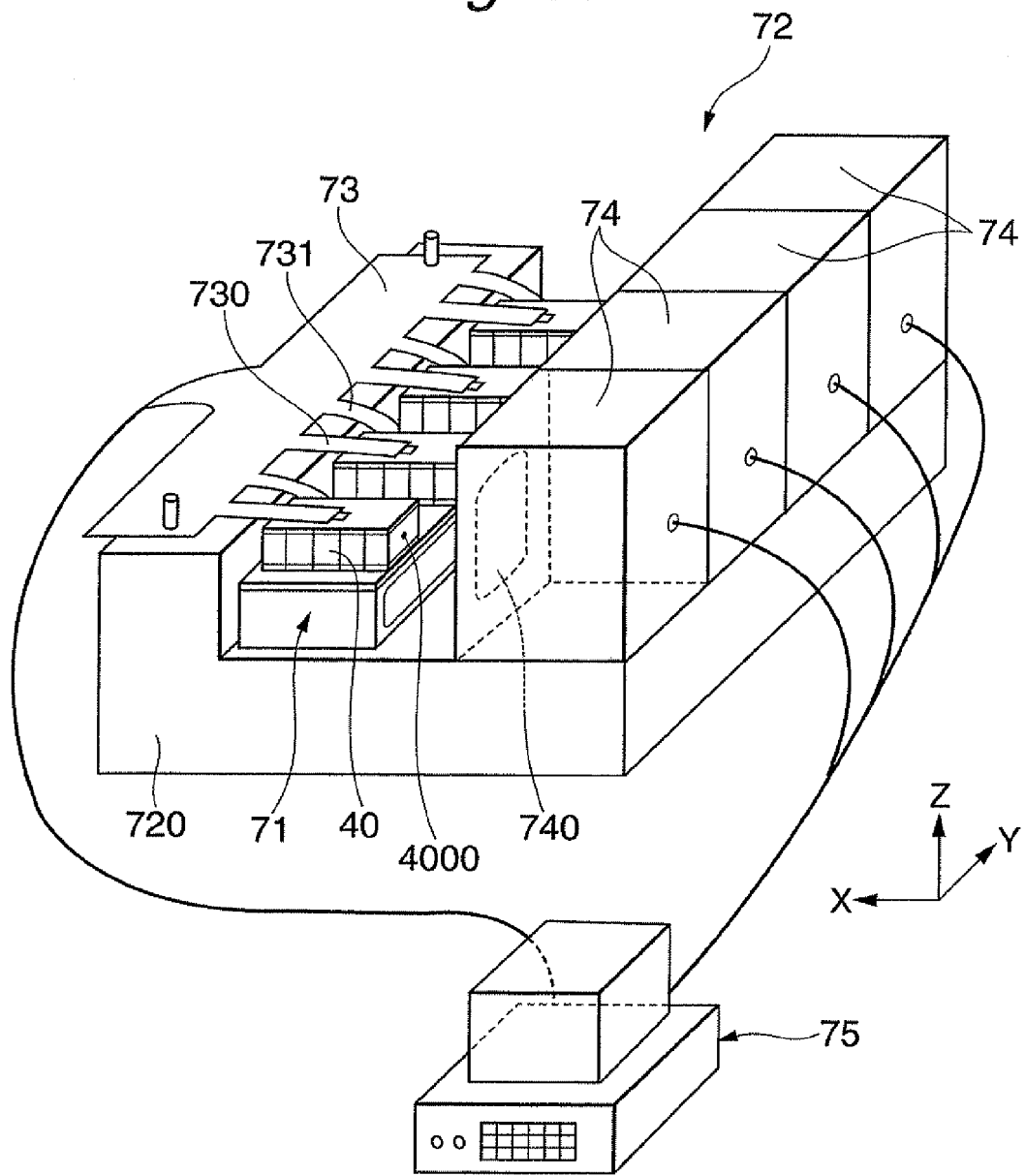

Then, as illustrated in FIG. 6d, the burn-in test apparatus 72 is used to perform burn-in test on the set light-source-unit bar 71. The burn-in test apparatus 72 includes the holding jig 720 and the sheet-type probe set 73 described above, multiple photodiodes 74 held in the holding jig 720, and a controller 75. Each of the photodiodes 74 is a photodetector that receives at a light-receiving surface 740 laser light emitted from a laser diode 40 to which electric current is being supplied through the sheet-type probe set 73 and measures light output from the laser diode 40. The controller 75 is a device that receives the measured outputs from the photodiodes 74 and controls and measures electric currents to be supplied to the laser diodes 40. The controller 75 may be a computer including control software.

In the burn-in test, first the controller 75 supplies electric current to the laser diodes 40 mounted on the light-source-unit bar 71 through the sheet-type probe set 73 and determines a value $I_{OP0}$ of the supply current $I_{OP}$ required for obtaining predetermined light output $P_{LA0}$, for example several tens of mW, from each laser diode 40. The value $I_{OP0}$ may be several tens of mA, for example. Here, light output from each laser diode 40 is determined on the basis of a measurement output from the photodiode 74 with a light-receiving surface 740 that faces the light-emitting center 4000 of that laser diode 40. The controller 75 then continues supplying the current $I_{OP}$ to the laser diodes 40 while constantly controlling the current $I_{OP}$ so that light output $P_{LA}$ from each laser diode 40 takes on the predetermined value $P_{LA0}$. In this case, the value of supply current $I_{OP}$ at the start of the test is $I_{OP0}$.

The controller 75 then measures changes in the value of the supply current $I_{OP}$, to each laser diode 40 over a predetermined period of time while the light output from each laser diode 40 is kept at the constant value $P_{LA0}$. After the lapse of the predetermined period, the controller 75 identifies laser diodes 40 for which supply current $I_{OP}$ exceeds a predetermined upper limit value $I_{MAX}$ as defective, and generates a list of the defective laser diodes 40.

In the burn-in test of the embodiment described above, the sheet-type probes can be kept in stable contact with electrodes on a light-source-unit bar 71 on which multiple electrodes are provided in positions at different heights, because electrodes in a higher position have a higher surface roughness Ra than electrodes in a lower position. Consequently, stable and reliable burn-in test can be performed. In addition, the multiple laser diodes 40 on the light-source-unit bar 71 can be evaluated at a time before the light-source-unit bar 71 is diced into individual light-source-unit chips. The simultaneous process enables burn-in test to be performed on a large number of laser diodes 40 at a time and therefore the man-hours and time required for the reliability evaluation process can be significantly reduced.

Referring to FIG. 9, practical examples of the burn-in test conducted on a light-source-unit bar 71 will be described below. FIG. 9 shows a graph of changes over time in current $I_{OP}$ supplied to the laser diode 40.

In the practical examples, sheet-type probes 730 and 731 having a 20-μm-thick conductive layer of Cu coated with a 10-μm-thick conductive overcoat layer of Au were brought into contact with 0.1-μm-thick n-electrodes 40a made of Au with a surface roughness Ra1 of 5.5 μm and 3-μm-thick lead electrodes 411 made of Au with a surface roughness Ra2 of 0.1 μm located in positions 50 μm lower than the n-electrodes 40a, respectively. Pre-experiments showed that currents in the range of 5 to 200 mA flew stably through the contact positions. The surface roughness Ra was measured under a blue laser microscope VL200D-A from Lasertec, Inc.

The number of edge-emitting laser diodes 40 (samples) on the light-source-unit bar 71 under test was 200. Light output $P_{LA0}$ of each laser diode 40 was kept constant at 60 mW during the test. The upper limit $I_{MAX}$ of the supply current on which the acceptability determination was based was set to 110 mA. The pass/fail testing time for which supply current $I_{OP}$ was being passed through the laser diodes 40 was 300 minutes.

It can be seen from FIG. 9 that the supply currents $I_{OP}$ to the laser diodes 40 except samples 90 to 93 initially took values $I_{OP0}$ in the range of approximately 80 to 95 mA and then gradually increased with time until approximately 25 minutes after the start of current supply, then remained at constant values at or below the upper limit $I_{MAX}$=110 mA. It is determined from the results that the samples except samples 90 to 93 are non-defective.

On the other hand, the supply currents $I_{OP}$ to samples 90, 92 and 93 exceeded the upper limit $I_{MAX}$=110 mA approximately 20 minutes after the start of the current supply. The supply current $I_{OP}$ to sample 91 exceeded the upper limit $I_{MAX}$=110 mA approximately 100 minutes after the start of the current supply. The supply currents $I_{OP}$ to samples 90 to 93 continued increasing after exceeding the upper limit $I_{MAX}$=110 mA. It is determined from the results that the samples 90 to 93 are defective. There was a steep rise in supply current $I_{OP}$ to each of these samples 90 to 93 in the practical examples at a certain point in time. The steep rise may indicate that dielectric breakdown occurred in these samples. The initial values $I_{OP0}$ of supply current to these samples were also beyond the range of initial values $I_{OP0}$ of the non-defective samples described above.

It will be understood from the practical examples descried above that, reliable, good burn-in test can be performed on an uneven object under test like the light-source-unit bar 71 by appropriately adjusting the surface roughness Ra of electrodes according to the present invention.

Figure 6E:
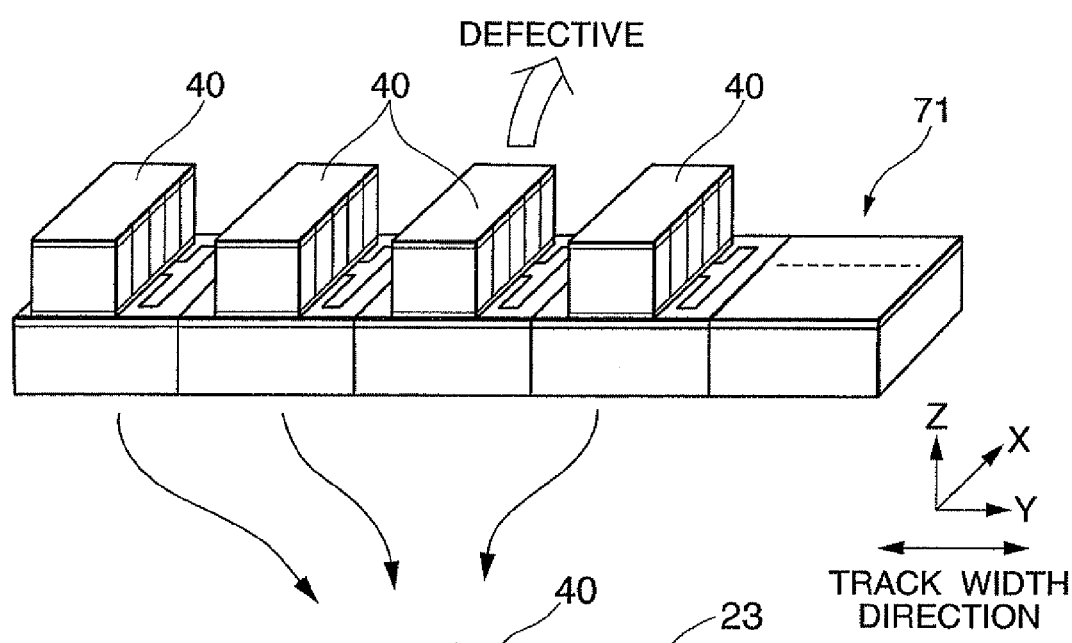
Figure 6F:
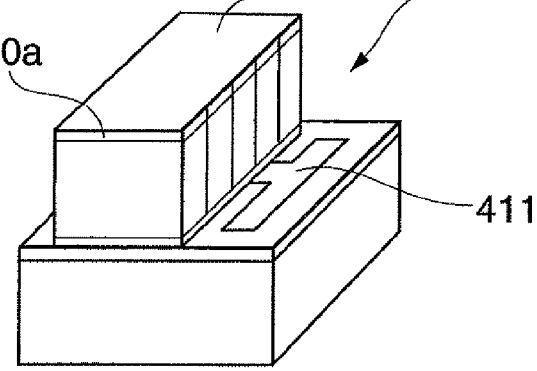

After the burn-in test on the light-source-unit bar 71, the light-source-unit bar 71 is diced into light-source-unit chips as illustrated in FIG. 6e. Light-source-unit chips including defective laser diodes 40 (samples 90 to 93 in the practical examples shown in FIG. 9) are eliminated from among the diced chips to obtain non-defective light-source-unit chips for use as light source units 23, as illustrated in FIG. 6f. The defective laser diodes 40 can be identified with reference to a list of defective laser diodes which is held by the controller 75. With this, the manufacturing process of the light source unit 23, including screening by the burn-in test according to the present invention, is completed.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:

1. A method for performing a burn-in test on an object under test in which a plurality of electrodes are provided in positions at different heights, the method comprising steps of:
   preparing an object under test in which an electrode in a higher position have a higher surface roughness among the plurality of electrodes;
   bringing a plurality of sheet-type probes into contact with the plurality of electrodes, respectively; and supplying an electric current with the plurality of electrodes through the plurality of sheet-type probes,
   wherein the object under test includes a plurality of units provided on a wafer or a bar, each of the units including: an element having a predetermined height; and a lower electrode electrically connected to a lower surface of the element, and wherein the object under test is prepared in such a manner that a surface roughness of an upper electrode on the upper surface of the element is higher than a surface roughness of the lower electrode.

2. The method for performing a burn-in test as claimed in claim 1, wherein the object under test is prepared by grinding a surface of a substrate of the element to a predetermined surface roughness, the surface being on a side on which the upper electrode is to be formed, then forming the upper electrode on the surface and thus providing a predetermined surface roughness to a surface of the upper electrode.

3. A method for performing a burn-in test on a unit bar to be divided into chips, each of the chips being configured to be used as a light source unit for thermally-assisted magnetic recording, the light source unit including a laser diode provided in a unit substrate, the method comprising steps of:
preparing a unit bar in such a manner that an upper electrode on an upper surface of the laser diode has a surface roughness higher than a lower electrode electrically connected to a lower surface of the laser diode;
bringing a sheet-type probe for the upper electrode and a sheet-type probe for the lower electrode into contact with the upper electrode and the lower electrode, respectively; and
supplying an electric current to the laser diode through the sheet-type probe for the upper electrode and the upper electrode and through the sheet-type probe for the lower electrode and the lower electrode.

4. The method for performing a burn-in test as claimed in claim 3, wherein the unit bar is prepared in such a manner that a height of the laser diode is 40 micrometers or more and is 100 micrometers or less.

5. The method for performing a burn-in test as claimed in claim 3, wherein the unit bar is prepared in such a manner that the surface roughness Ra of the upper electrode is 0.5 micrometer or more and is 10 micrometers or less, and a surface roughness Ra of the lower electrode is 0.005 micrometer or more and is 0.5 micrometer or less.

6. The method for performing a burn-in test as claimed in claim 3, wherein the unit bar is prepared by grinding a surface of a substrate of the laser diode to a predetermined surface roughness, the surface being on a side on which the upper electrode is to be formed, then forming the upper electrode on the surface and thus providing a predetermined surface roughness to a surface of the upper electrode.

7. The method for performing a burn-in test as claimed in claim 3, wherein the sheet-type probes for the upper electrode and the lower electrode comprise a base element, an insulating layer formed on the base element, and a conductive layer formed on the insulating layer, and the conductive layer protrudes from the base element on a side on which the conductive layer contacts the lower electrode or the upper electrode.

8. The method for performing a burn-in test as claimed in claim 7, wherein at least a portion of the conductive layer on a side on which the conductive layer contacts the lower electrode or the upper electrode is covered with gold or a gold alloy.

9. The method for performing a burn-in test as claimed in claim 3, wherein the laser diode is supplied with an electric current, then measuring changes over time in electric current supplied to the laser diode required for obtaining a predetermined light output from the laser diode.

10. A test apparatus configured to implement the method for performing a burn-in test as claimed in claim 4, the test apparatus comprising:
a holding jig for holding the unit bar;
a sheet-type probe set including sheet-type probes for upper electrodes and sheet-type probes for lower electrodes, one sheet-type probe for the upper electrode and one sheet-type probe for the lower electrode being arranged alternately, the upper electrode being provided on the laser diode and having a surface roughness higher than the lower electrode;
a photodetector held by the holding jig, the photodetector receiving laser light emitted from the laser diode supplied with an electric current through the sheet-type probe set, and measuring light output of the laser diode; and
a controller receiving a measurement output from the photodetector and controlling and measuring an electric current supplied to the laser diode.

11. The test apparatus as claimed in claim 10, wherein a height of the laser diode is 40 micrometers or more and is 100 micrometers or less.

12. The test apparatus as claimed in claim 10, wherein the surface roughness Ra of the upper electrode is 0.5 micrometer or more and is 10 micrometers or less, and a surface roughness Ra of the lower electrode is 0.005 micrometer or more and is 0.5 micrometer or less.

13. The test apparatus as claimed in claim 10, wherein the sheet-type probes for the upper electrode and the lower electrode comprise a base element, an insulating layer formed on the base element, and a conductive layer formed on the insulating layer, and the conductive layer protrudes from the base element on a side on which the conductive layer contacts the lower electrode or the upper electrode.

14. The test apparatus as claimed in claim 13, wherein at least a portion of the conductive layer on a side on which the conductive layer contacts the lower electrode or the upper electrode is covered with gold or a gold alloy.

* * * * *